United States Patent
Hayakawa

[11] Patent Number: 5,902,717
[45] Date of Patent: May 11, 1999

[54] METHOD OF FABRICATING SEMICONDUCTOR DEVICE USING HALF-TONE PHASE SHIFT MASK

[75] Inventor: Tsutomu Hayakawa, Tokyo, Japan

[73] Assignee: NEC Corporation, Tokyo, Japan

[21] Appl. No.: 08/797,340

[22] Filed: Feb. 10, 1997

[30] Foreign Application Priority Data

Feb. 28, 1996 [JP] Japan ................................. 8-041043

[51] Int. Cl.⁶ ......................................................... G03F 7/20
[52] U.S. Cl. ........................ 430/312; 430/315; 430/396; 438/946
[58] Field of Search .................................. 430/394, 396, 430/312, 313, 318, 315; 438/946

[56] References Cited

U.S. PATENT DOCUMENTS 5,451,537  9/1995  Tseng et al. .............................. 438/253
5,700,606  12/1997  Kobayashi et al. ...................... 430/322

FOREIGN PATENT DOCUMENTS 401258419  10/1989  Japan .
5-197160  8/1993  Japan .

*Primary Examiner*—Kathleen Duda
*Attorney, Agent, or Firm*—Hayes, Soloway, Hennessey, Grossman & Hage, P.C.

[57] ABSTRACT

A method of fabricating a semiconductor device having a semiconductor substrate, a chip region and a scribe region, includes a step of forming a first hole in an insulating film on the chip region by using a step-and-repeat lithography system using a half-tone phase shift mask, and forming a conductive film on an entire surface of the semiconductor substrate. The conductive film is patterned such that the conductive film remains at least at a second hole and its peripheral portion, the second hole resulting in being formed at a four-fold exposure portion which is a portion where a plurality of shots have overlapped at the scribe region during the step of forming the first hole. Since the conductive film remains at the second hole and its peripheral portion, it is possible to prevent the formation of residue of the conductive film at sidewalls of the second hole when the conductive film is etched away from the scribe region.

4 Claims, 5 Drawing Sheets

METHOD OF FABRICATING SEMICONDUCTOR DEVICE USING HALF-TONE PHASE SHIFT MASK

BACKGROUND OF THE INVENTION (1) Field of the Invention

The present invention relates to a method of fabricating a semiconductor device, and more particularly to a method of fabricating a semiconductor device using a half-tone phase shift mask.

(2) Description of the Related Art

With advancement in semiconductor fabrication techniques, semiconductor elements are being more highly integrated and miniaturized. In recent years, a half-tone phase shift method developed for the expansion of process margins is becoming a leading technique in the related field. The half-tone phase shift method is a lithography method using mask patterns that are formed by a semitransparent film having a light transmittivity of 1–16% and an optical phase difference of within 180±10° with respect to an optically transmitting portion. With this method, a sharp image intensity (shifter edge effect) is produced at an edge portion due to an optical phase inversion effect that develops at the mask pattern edge portion, thus enabling to enhance the resolution. However, when the half-tone phase shift method is used, since the semitransparent film having a light transmittivity of 1–16% is used as a mask, there has been a problem that film thinning occurs in the resist film of the patterns. According to a method proposed in Japanese Patent Application Kokai Publication No. Hei 5-197160, it is attempted to overcome the above problem by hardening the surface of the photoresist film.

When a mask pattern is transferred onto a photoresist film on a wafer using a step-and-repeat lithographic system, a region irradiated by one exposure (shot) is set so as to cover at least one chip region, and a repeat margin of a predetermined dimension is provided therein so that there occurs no gap between shots caused by misalignment between individual steps. As shown in FIG. 1, for example, the edge of a shot A comes on a scribe region which defines chip regions on the wafer, but this edge extends outwardly by the extent of the repeat margin 102 (for example, 2 μm) from the center lines 101-1, 101-2 of the scribe region.

Thus, when the exposure of the entire wafer surface has been completed, there are overlapped portions of a plurality of shots (hereinafter referred to as overlap exposure portions). In relation to the overlap exposure portions, there are problems in the case of a half-tone phase shift method, which are explained below.

The half-tone phase shift mask is often used in the formation of a contact hole. As shown in FIG. 2A, for providing a contact hole to an insulating film 2 on a silicon substrate 1, a photoresist film 3 is formed, and a hole 4 for the formation of the contact hole is provided in a chip region I by a step exposure and development using the half-tone phase shift mask. The numeral III represents the center line position of the scribe region. In this case, a hole 5 is often unavoidably formed also at a four-fold exposure portion (103 in FIG. 1). This is because the exposure is made four times by the light transmitted through the semitransparent film of the half-tone phase shift mask. Using current techniques, it is not possible to sufficiently avoid the formation of such a hole in the photoresist film at the four-fold exposure portion. Next, by etching the insulating film 2 using the photoresist film 3 as a mask, the contact hole 6 as shown in FIG. 2B is formed. At that time, a hole 7 results in being formed at the four-fold exposure portion. Thereafter, a conductive film, such as an Al-Si-Cu alloy film 8, is formed and also a photoresist film 9 for the formation of interconnect layers is formed. The photoresist film 9 is not formed on the scribe region II, and this is for avoiding the scattering of conductive matter when the divisions are made by the scribing. Next, by using the photoresist film 9 as a mask, the Al-Si-Cu alloy film 8 is patterned and the interconnect layer 8a is formed. At that time, the residue 10 of Al-Si-Cu tends to be present at sidewalls of the hole 7.

The problems in the prior art, therefore, are that, as explained above, when the contact hole is formed in the insulating film on a wafer by the step exposure using the half-tone phase shift mask, there is also unavoidably formed a hole at the overlap exposure portion of the scribe region, and this results in a state wherein, during the subsequent interconnect layer formation, the residue of conductive matter is present at the sidewalls of the hole. During the cleaning step, the residue peels off and becomes a cause of producing dust or contaminants which lead to the lowering of the yield and the reliability.

SUMMARY OF THE INVENTION

An object of the present invention, therefore, is to overcome the problems existing in the prior art, and to provide a method of fabricating with which it is possible to prevent the occurrence of contaminants when a contact hole is formed using a half-tone phase shift mask.

According to one aspect of the invention, there is provided a method of fabricating a semiconductor device having a semiconductor substrate, a chip region and a scribe region, the method comprising the steps of:

forming an insulating film on the semiconductor substrate;

forming a first hole in the insulating film on the chip region by using a step-and-repeat lithography system using a half-tone phase shift mask;

forming a conductive film on an entire surface of the semiconductor substrate; and patterning the conductive film such that the conductive film remains at least at a second hole and its peripheral portion, the second hole resulting in being formed at a four-fold exposure portion which is a portion where a plurality of shots have overlapped at the scribe region during the step of forming the first hole.

The patterning step may include an exposure process using a transmission type mask.

Also, the conductive films remained at the four-fold exposure portion are made progressively larger in size with each being made larger than an underlying one.

According to the invention, since the conductive film pattern is left at the second hole and its peripheral portion, the residue which is otherwise present at the sidewalls of the second hole and which peels off during the cleaning step is not present.

More specifically, after the first hole is formed in the insulating film on a wafer by using a step-and-repeat lithography system and utilizing a half-tone phase shift mask, the conductive film is deposited on the insulating film and the conductive film is patterned such that this conductive film remains at the second hole, which results in being formed on the insulating film at the four-fold exposure portion, and at its peripheral portion. In this way, during the etch-removing of the conductive film from the entire area of the scribe region, it is possible to prevent the formation of residue of the conductive film at the sidewalls and the peripheral portion of the second hole, thus enabling the prevention of the lowering of the yield and the reliability caused by the contaminants resulting from the peeling off of the residue during the cleaning operation.

BRIEF DESCRIPTION OF THE DRAWINGS

The above and other objects, features and advantages of the present invention will be apparent from the following description of a preferred embodiment of the invention explained with reference to the accompanying drawings, in which.

PREFERRED EMBODIMENT OF THE INVENTION

Now, a preferred embodiment of the invention is explained with reference to the drawings.

Figure 1:
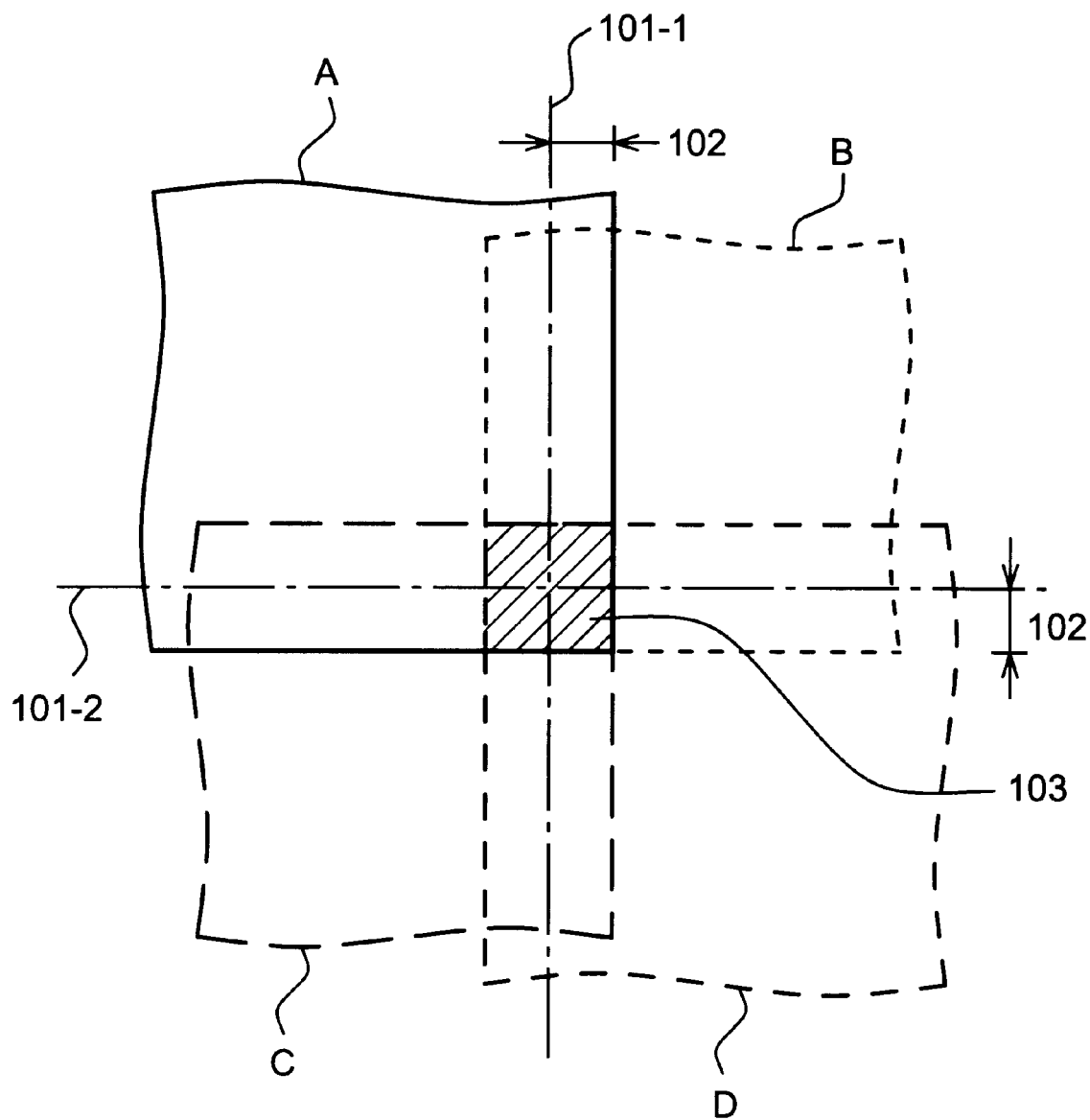
FIG. 1 is a plan view for showing an overlap exposure portion which develops when the step exposure using a half-tone phase shift mask is carried out.
Figure 2A:
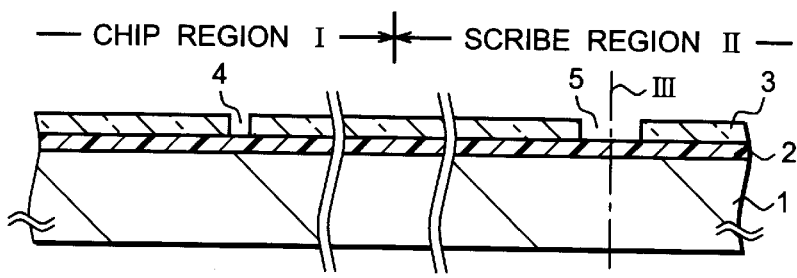
FIGS. 2A, 2B and 2C are sectional views of a part of a semiconductor device, for use in explaining steps of a conventional method of fabricating the semiconductor device.
Figure 2B:
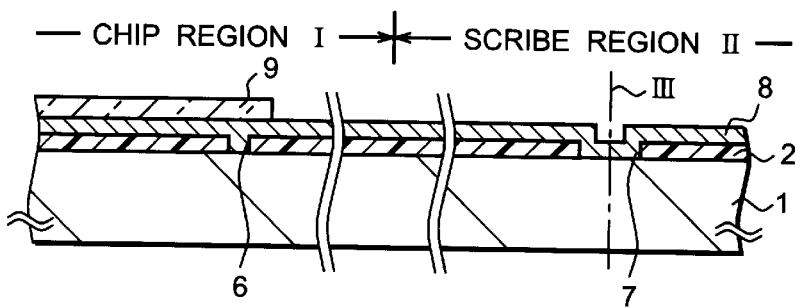
Figure 2C:
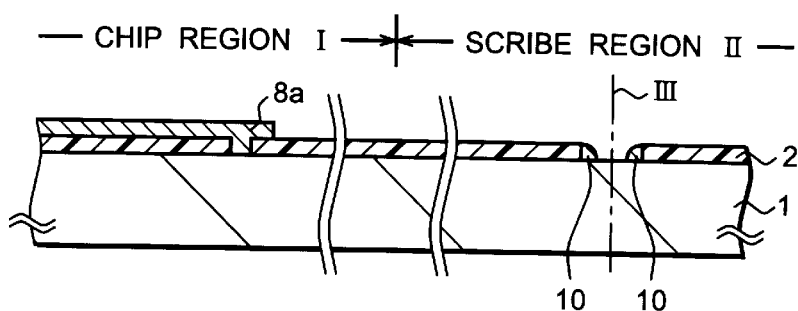
Figure 3A:
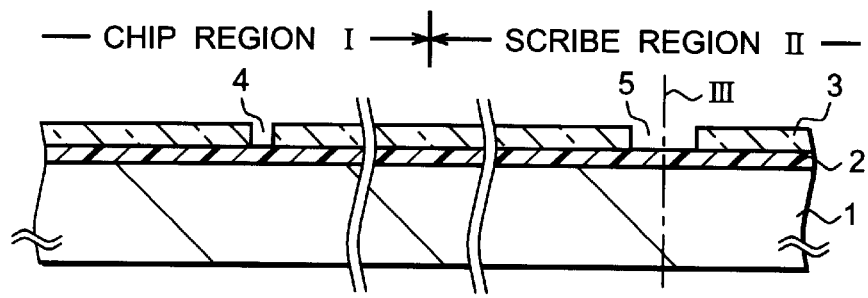
FIGS. 3A–3G are sectional views of a part of a semiconductor device fabricated by a method according to the invention, for use in explaining steps of the method according to the invention.

FIG. 3A shows that a silicon oxide film (an interlayer insulating film 2) having a thickness of 500 nm is formed after the formation of a field oxide film, a gate insulating film, a gate electrode and a source/drain region (all not shown) on a surface of a P-type silicon substrate 1 and, thereafter, a photoresist film 3 is formed for the formation of a contact hole which reaches, for example, the source/drain region. At this time, by carrying out the step exposure of a wafer using a half-tone phase shift mask, a hole 4 for the formation of the contact hole is formed but, at the same time, a hole 5 results in being formed at a four-fold exposure portion on a scribe region II. This aspect is the same as that already explained with respect to the prior art.

Figure 3B:
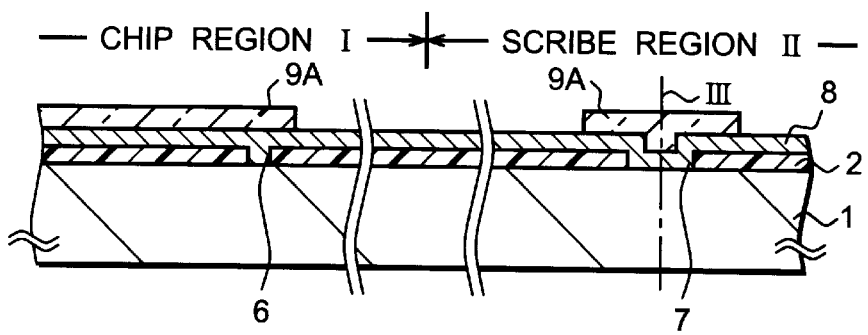

Next, the interlayer insulating film 2 is etched using the photoresist film 3 as a mask and a contact hole 6 (first hole) is formed as shown in FIG. 3B, but a second hole 7 is also unavoidably formed at the four-fold exposure portion. Then, a conductive film, such as Al-Si-Cu film 8, is formed, and a photoresist film 9A for the formation of an interconnect layer is formed. At this time, the photoresist film 9A is also formed in the hole 7 and on its peripheral portion. The exposure mask used for this purpose is a commonly used mask (hereinafter referred to as a "transmission type mask") which has been in use since before the phase shift mask was proposed.

Figure 4:
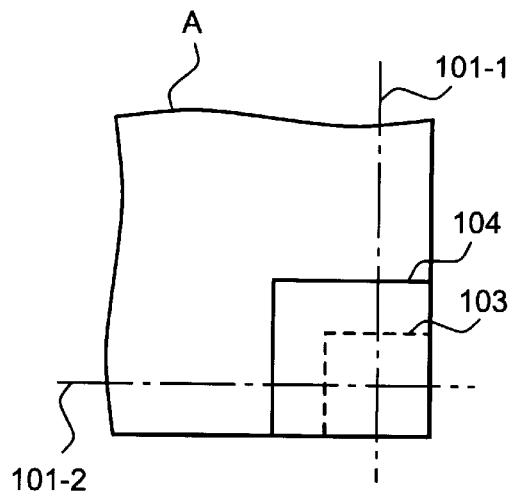
FIG. 4 is a plan view of a part of the semiconductor device fabricated by the method according to the invention, for use in explaining an embodiment according to the invention.

As shown in FIG. 4, if a mask is of a rectangular shape, a shielding film may be provided at each corner thereof so that the four-fold exposure portion 103 (a 4 μm×4 μm region when the repeat margin 102 is 2 μm) at, for example, a shot A is shielded so that a square region 104 of, for example, 6 μm×6 μm is not irradiated by the exposure light. Here, use is made of a positive type photoresist and a negative type photo mask.

Figure 3C:
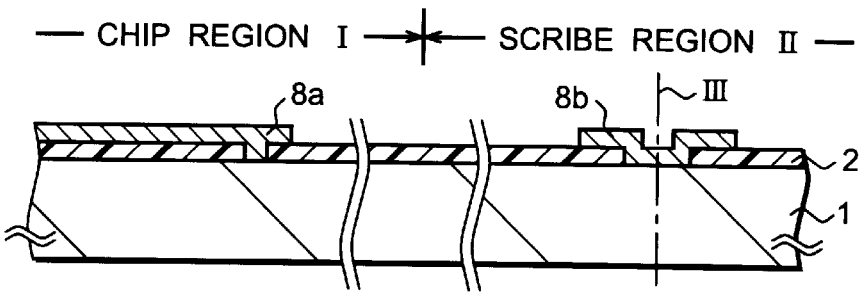
Figure 3D:
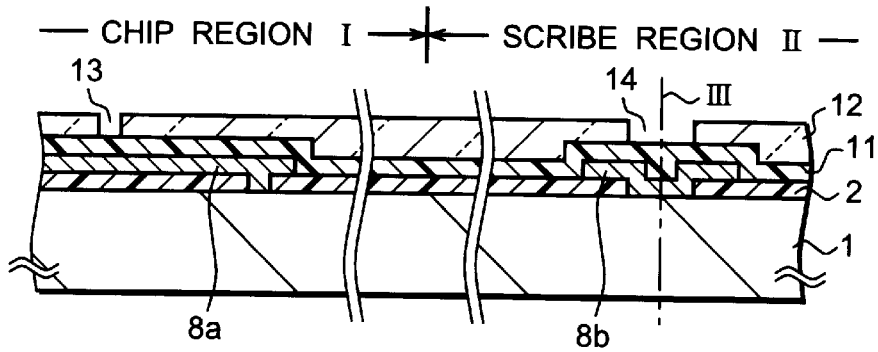
Figure 3E:
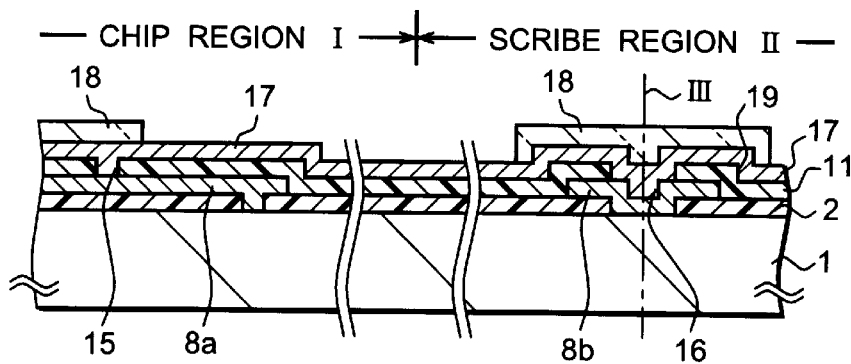

Next, the Al-Si-Cu alloy film 8 is anisotropically etched using the photoresist film 9A as a mask and, as shown in FIG. 3C, an interconnect layer 8a and a conductive film pattern 8b are formed. Then, in the case of a single-layer interconnect semiconductor device, in the interlayer insulating film 2 on the scribe region II, the portions that are not covered by the conductive film pattern 8b are removed. In the case of a multi-layer interconnect semiconductor device, as shown in FIG. 3D, a silicon oxide film (interlayer insulating film 11) having a thickness of 400 nm is deposited, and a photoresist film 12 having a hole 13 for the formation of a contact hole on the interconnect layer 8a is formed using a half-tone phase shift mask. A hole 14 is also formed above the conductive film pattern 8b. Next, the interlayer insulating film 11 is etched away using the photoresist film 12 as a mask and, as shown in FIG. 3E, holes 15 and 16 are formed.

Figure 3F:
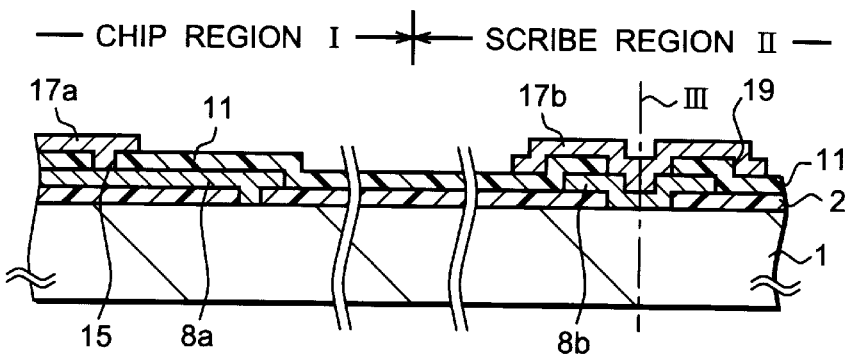
Figure 3G:
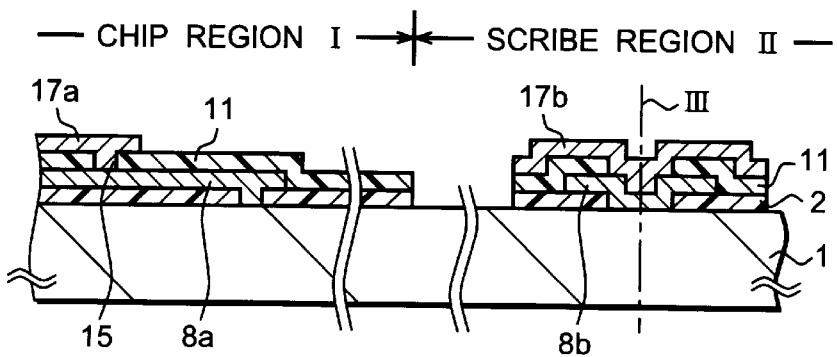

Next, a conductive film, such as an Al-Cu-Si alloy film 17, is formed, and a photoresist film 18 for the formation of an upper interconnect layer is formed by using a transmission type mask. At this time, the photoresist film 18 is formed such that it remains in the hole 16 and on its peripheral portion so as to cover steps of the interlayer insulating film 11 that develop at an edge portion of the conductive film pattern 8b. Then, the Al-Si-Cu alloy film 17 is anisotropically etched and, as shown in FIG. 3F, an interconnect 17a and a conductive film pattern 17b are formed. If the size of the conductive film pattern 17b is the same extent as that of the conductive film pattern 8b, this allows the residue of Al-Si-Cu alloy to be present on the sidewalls of the steps 19. In order to prevent this, the size of the conductive film pattern 17 b is set larger, for example, to about 8 μm×8 μm. In the case of a double-layer interconnect semiconductor device, the interlayer insulating films 2 and 11 of the scribe region II are removed in the subsequent step as shown in FIG. 3G. At portions of the scribe region II, there remain laminates of the interlayer insulating film and the conductive film pattern but, since the area occupied thereby is small as compared to the size of the scribe region (for example, 100 μm in width), there is almost no effect on the lowering of the yield caused by the scattering of conductive matter during the scribing process. In the case of a semiconductor device having three interconnect layers or more, the same procedure may be repeated. In such a case, the sizes of the conductive film patterns to be left at the four-fold exposure portion may be made sequentially larger towards an upper layer.

Figure 5:
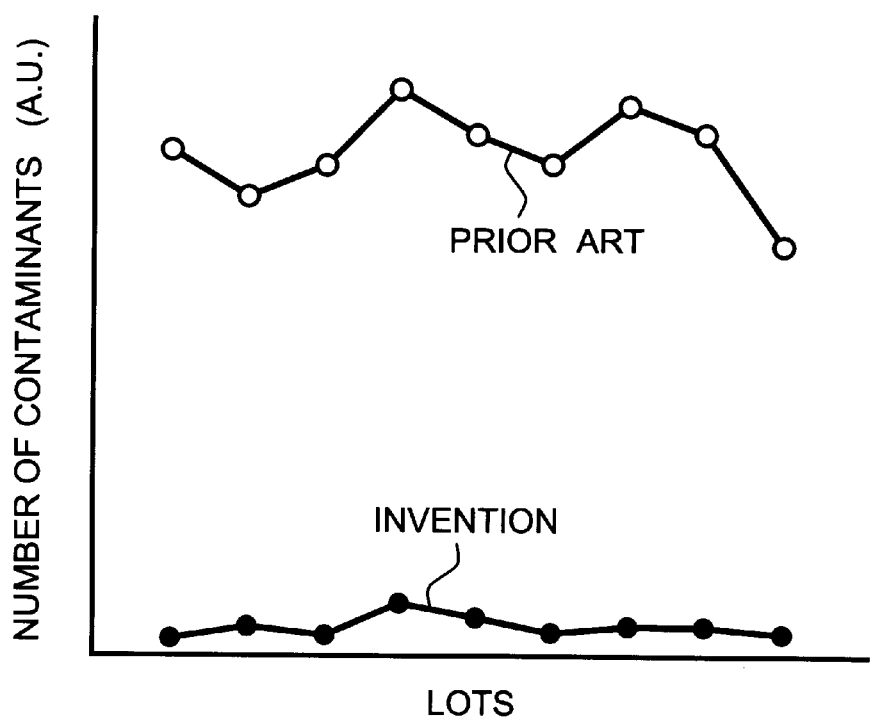
FIG. 5 is a graph showing the number of contaminants on a lot to lot basis.
Figure 6:
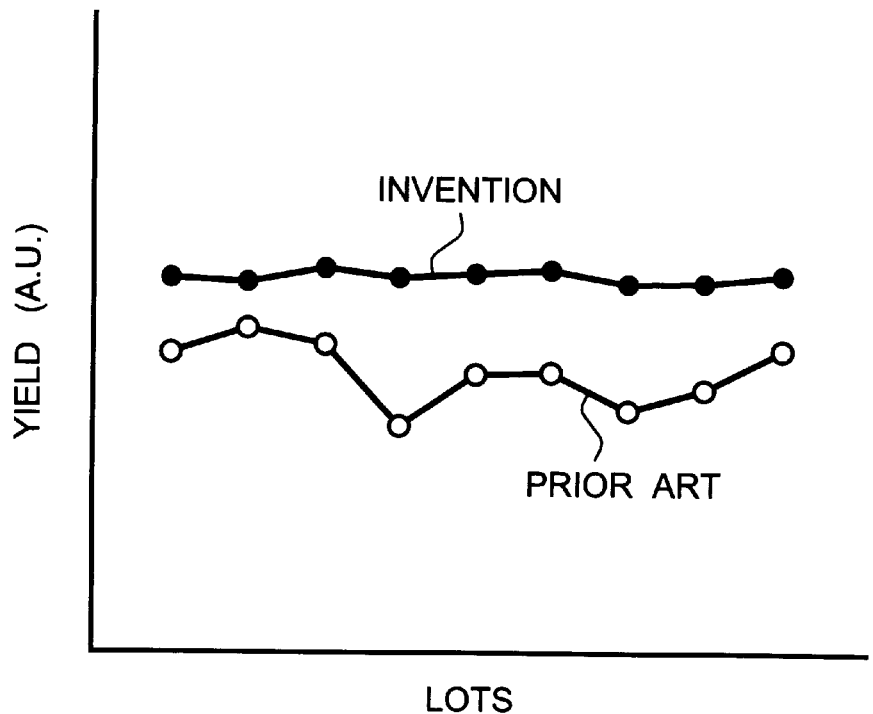
FIG. 6 is a graph showing the yield on a lot to lot basis.

FIGS. 5 and 6 respectively show the comparison between the number of contaminants and the yield per wafer (260 chips) in a semiconductor device of the embodiment according to the invention (a double-layer interconnect semiconductor device) and those in the prior art semiconductor device. Here, the number of contaminants was counted using an automatic external appearance inspection system which is used in such testing as for pattern defects in masks. This system is capable of measuring a contaminant whose magnitude is on the order of at least 0.5 μm. It has been confirmed that the number of contaminants has been reduced from 50–70 to below 10, the yield has been enhanced by several percent, and variations among lots have been reduced.

While the invention has been described in its preferred embodiment, it is to be understood that the words which have been used are words of description rather than limitation and that changes within the purview of the appended claims may be made without departing from the true scope of the invention as defined by the claims.

What is claimed is:

1. A method of fabricating a semiconductor device having a semiconductor substrate, a chip region and a scribe region, said method comprising the steps of:

forming an insulating film on said semiconductor substrate forming a first hole in said insulating film on said chip region by using a step-and-repeat lithography system using a half-tone phase shift mask;

forming a conductive film on an entire surface of said semiconductor substrate; and patterning said conductive film such that said conductive film remains at least at a second hole and its surrounding portion on said insulating film, said second hole being formed at a four-fold exposure portion which is a portion where four shots have overlapped at said scribe region during the step of forming said first hole.

2. The method of fabricating a semiconductor device according to claim 1, in which the step of patterning includes an exposure process using a transmission mask.

3. The method of fabricating a semiconductor device according to claim 2, which further comprises the steps of forming further conductive films and patterning said further conductive films, and in which said further conductive films remaining over said second hole and its surrounding portion on said insulating film are made progressively larger in area with each being made larger than an underlying conductive film.

4. The method of fabricating a semiconductor device according to claim 1, which further comprises the steps of forming further conductive films and patterning said further conductive films, and in which said further conductive films remaining over said second hole and its surrounding portion on said insulating film are made progressively larger in area with each being made larger than an underlying conductive film.

* * * * *